United States Patent
Piechocinski et al.

(10) Patent No.: US 11,337,010 B2
(45) Date of Patent: May 17, 2022

(54) MEMS DEVICE AND PROCESS

(71) Applicant: Cirrus Logic International Semiconductor Ltd., Edinburgh (GB)

(72) Inventors: Marek Sebastian Piechocinski, Edinburgh (GB); Roberto Brioschi, Austin, TX (US); Rkia Achehboune, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 246 days.

(21) Appl. No.: 16/605,155

(22) PCT Filed: Apr. 13, 2018

(86) PCT No.: PCT/GB2018/050982
§ 371 (c)(1),
(2) Date: Oct. 15, 2019

(87) PCT Pub. No.: WO2018/197836
PCT Pub. Date: Nov. 1, 2018

(65) Prior Publication Data
US 2021/0144482 A1    May 13, 2021

Related U.S. Application Data

(60) Provisional application No. 62/491,480, filed on Apr. 28, 2017.

(30) Foreign Application Priority Data

May 25, 2017 (GB) ..................................... 1708347

(51) Int. Cl.
*B81B 3/00* (2006.01)
*H04R 19/00* (2006.01)
(Continued)

(52) U.S. Cl.
CPC ......... *H04R 19/005* (2013.01); *B81B 3/0021* (2013.01); *B81C 3/001* (2013.01);
(Continued)

(58) Field of Classification Search
USPC .................................................. 257/416, 438
(Continued)

(56) References Cited

U.S. PATENT DOCUMENTS

2005/0018864 A1    1/2005  Minervini
2009/0154872 A1*   6/2009  Sherrer ............... G02B 6/4248
                                                          385/14
(Continued)

FOREIGN PATENT DOCUMENTS

CN    103663346 A    3/2014
CN    104080033 A    10/2014
(Continued)

OTHER PUBLICATIONS

English-German Translation of DE-10036433. Feb. 2002.*
(Continued)

*Primary Examiner* — Hrayr A Sayadian
(74) *Attorney, Agent, or Firm* — Jackson Walker L.L.P.

(57) ABSTRACT

The present disclosure describes techniques for altering the epoxy wettability of a surface of a MEMS device. Particularly applicable to flip-chip bonding arrangements in which a top surface of a MEMS device is adhered to a package substrate. A barrier region is provided on a top surface of the MEMs device, laterally outside a region which forms, or overlies, the backplate and/or the cavity in the transducer substrate. The barrier region comprises a plurality of discontinuities, e.g. dimples, which inhibit the flow of epoxy.

19 Claims, 11 Drawing Sheets

(51) Int. Cl.
    *B81C 3/00*     (2006.01)
    *H04R 19/04*     (2006.01)

(52) U.S. Cl.
    CPC ...... *H04R 19/04* (2013.01); *B81B 2201/0257* (2013.01); *B81B 2203/0127* (2013.01); *B81B 2203/033* (2013.01); *B81B 2203/0315* (2013.01); *B81B 2203/0353* (2013.01); *H04R 2201/003* (2013.01)

(58) Field of Classification Search
    IPC .............. H04R 19/005,19/04, 2201/003; B81B 3/0021, 2201/0257, 2203/0127, 2203/0315, 2203/033, 2203/0353; B81C 3/001
    See application file for complete search history.

(56) References Cited

U.S. PATENT DOCUMENTS

| | | | |
|---|---|---|---|
| 2010/0109103 A1 | 5/2010 | Tsao | |
| 2011/0303994 A1* | 12/2011 | Jenkins | B06B 1/0292 257/416 |
| 2013/0147016 A1* | 6/2013 | Hauenstein | H01L 23/62 257/536 |
| 2014/0084396 A1* | 3/2014 | Jenkins | B81C 1/00158 257/419 |
| 2014/0161290 A1* | 6/2014 | Jenkins | H04R 23/006 381/174 |
| 2014/0291785 A1 | 10/2014 | Kasai et al. | |
| 2015/0160086 A1* | 6/2015 | Ponath | C04B 37/006 73/724 |
| 2016/0009544 A1* | 1/2016 | Rothberg | B81B 3/0021 257/737 |
| 2017/0121173 A1* | 5/2017 | Hoekstra | H04R 1/04 |
| 2017/0156211 A1* | 6/2017 | Stabach | H05K 3/027 |
| 2017/0217760 A1* | 8/2017 | Piechocinski | G01L 9/0042 |
| 2017/0297905 A1* | 10/2017 | Saxena | B81B 7/02 |

FOREIGN PATENT DOCUMENTS

| | | | | |
|---|---|---|---|---|
| CN | 205071304 U | | 3/2016 | |
| DE | 10036433 A1 | * | 2/2002 | ........... G01L 9/0048 |
| EP | 2703338 A1 | | 3/2014 | |
| TW | 201637989 A | | 11/2016 | |
| WO | 2006102351 A1 | | 9/2006 | |
| WO | WO-2015189598 A1 | * | 12/2015 | ........... B81B 7/0051 |

OTHER PUBLICATIONS

PR/News Release of Cirrus Logic Completing Acquisition of Wolfson MicroElectronics. Aug. 2014.*
Examination Report under Section 18(3), UKIPO, Application No. GB1708347.8.
Rejection Decision, Taiwan Intellectual Property Office, Application No. 107113568, dated Dec. 30, 2019.
Examination Report under Section 18(3), UKIPO, Application No. GB1708347.8, dated Nov. 18, 2019.
Examination Report under Section 18(3), UKIPO, Application No. GB1708347.8, dated Feb. 12, 2020.
International Search Report and Written Opinion of the International Searching Authority, International Application No. PCT/GB2018/050982, dated Jun. 19, 2018.
Combined Search and Examination Report under Sections 17 and 18(3), UKIPO, Application No. GB1708347.8, dated Oct. 6, 2017.
Patent Application Search Report, Taiwan Intellectual Property Office, Application No. 107113568, dated May 7, 2019.
First Examination Opinion after Reexamination, Taiwan Intellectual Property Office, Application No. 107113568, dated Nov. 25, 2020.

* cited by examiner

MEMS DEVICE AND PROCESS

The present application is a 371 of International Patent Application No. PCT/GB2018/050982, filed Apr. 13, 2018, which claims priority to U.S. Provisional Patent Application Ser. No. 62/491,480, filed Apr. 28, 2017, and United Kingdom Patent Application Serial No. 1708347.8, filed May 25, 2017, each of which is incorporated by reference herein in its entirety.

TECHNICAL FIELD

This application relates to micro-electro-mechanical system (MEMS) devices and processes, and in particular to a MEMS device and process relating to a transducer, for example a capacitive microphone.

BACKGROUND INFORMATION

MEMS devices are becoming increasingly popular. MEMS transducers, and especially MEMS capacitive microphones, are increasingly being used in portable electronic devices such as mobile telephone and portable computing devices.

Microphone devices formed using MEMS fabrication processes typically comprise one or more moveable membranes and a static backplate, with a respective electrode deposited on the membrane(s) and backplate, wherein one electrode is used for read-out/drive and the other is used for biasing. A substrate supports at least the membrane(s) and typically the backplate also. In the case of MEMS pressure sensors and microphones the read out is usually accomplished by measuring the capacitance between the membrane and backplate electrodes. In the case of transducers, the device is driven, i.e. biased, by a potential difference provided across the membrane and backplate electrodes.

FIGS. 1a and 1b provide a schematic diagram and a perspective view, respectively, of a known capacitive MEMS microphone device 10. The capacitive microphone device 10 comprises a membrane layer 11 which forms a flexible membrane which is free to move in response to pressure differences generated by sound waves. A first electrode 3 is mechanically coupled to the flexible membrane, and together they form a first capacitive plate of the capacitive microphone device. A second electrode 2 is mechanically coupled to a generally rigid structural layer or backplate 4, which together form a second capacitive plate of the capacitive microphone device. In the example shown in FIG. 1a the second electrode 2 is embedded within the backplate structure 4.

The capacitive microphone is formed on a substrate 101, for example a silicon wafer, which may have upper and lower oxide layers 105, 103 formed thereon. A cavity or through-hole 8 in the substrate and in any overlying layers (hereinafter also referred to as a substrate cavity) is provided below the membrane, and may be formed for example using a "back-etch" through the substrate 101. The substrate cavity 8 connects to a first cavity 9 located directly below the membrane. These cavities 8 and 9 may collectively provide an acoustic volume thus allowing movement of the membrane in response to an acoustic stimulus. Interposed between the first and second electrodes 2 and 3 is a second cavity 11. A plurality of bleed holes 11 connect the first cavity 9 and the second cavity 10.

A plurality of acoustic holes 12 are arranged in the back-plate 4 so as to allow free movement of air molecules through the back plate, such that the second cavity 10 forms part of an acoustic volume with a space on the other side of the back-plate. The membrane 11 is thus supported between two volumes, one volume comprising cavities 9 and substrate cavity 8 and another volume comprising cavity 11 and any space above the back-plate. These volumes are sized such that the membrane can move in response to the sound waves entering via one of these volumes. Typically the volume through which incident sound waves reach the membrane is termed the "front volume" with the other volume, which may be substantially sealed, being referred to as a "back volume".

In some applications the backplate may be arranged in the front volume, so that incident sound reaches the membrane via the acoustic holes 12 in the backplate 4. In such a case the substrate cavity 8 may be sized to provide at least a significant part of a suitable back-volume. In other applications, the microphone may be arranged so that sound may be received via the substrate cavity 8 in use, i.e. the substrate cavity forms part of an acoustic channel to the membrane and part of the front volume. In such applications the backplate 4 forms part of the back-volume which is typically enclosed by some other structure, such as a suitable package.

It should also be noted that whilst FIGS. 1a and 1b shows the backplate 4 being supported on the opposite side of the membrane to the substrate 101, arrangements are known where the backplate is formed closest to the substrate with the membrane layer 11 supported above it.

In use, in response to a sound wave corresponding to a pressure wave incident on a MEMS microphone transducer, the membrane is deformed slightly from its equilibrium position. The distance between the lower electrode 3 and the upper electrode 2 is correspondingly altered, giving rise to a change in capacitance between the two electrodes that is subsequently detected by electronic circuitry (not shown).

To provide protection the MEMS transducer will typically be contained within a package. The package effectively encloses the MEMS transducer and can provide environmental protection and may also provide shielding for electromagnetic interference (EMI) or the like. The package also provides at least one external connection for outputting the electrical signal to downstream circuitry. For microphones and the like the package will typically have a sound port to allow transmission of sound waves to/from the transducer within the package and the transducer may be configured so that the flexible membrane is located between first and second volumes, i.e. spaces/cavities that may be filled with air (or some other gas suitable for transmission of acoustic waves), and which are sized sufficiently so that the transducer provides the desired acoustic response. The sound port acoustically couples to a first volume on one side of the transducer membrane, which may sometimes be referred to as a front volume. The second volume, sometimes referred to as a back volume, on the other side of the one or more membranes is generally required to allow the membrane to move freely in response to incident sound or pressure waves, and this back volume may be substantially sealed (although it will be appreciated by one skilled in the art that for MEMS microphones and the like the first and second volumes may be connected by one or more flow paths, such as small holes in the membrane, that are configured so as present a relatively high acoustic impedance at the desired acoustic frequencies but which allow for low-frequency pressure equalisation between the two volumes to account for pressure differentials due to temperature changes or the like).

Various package designs are known. For example, FIGS. 2a and 2b illustrate "lid-type" packages 200. A MEMS transducer 201 is mounted to an upper surface 220 of a package substrate 202. The package substrate 202 may be PCB (printed circuit board) or any other suitable material. A cover or "lid" 203 is typically located over the transducer 201 and is attached to the upper surface 220 of the package substrate 202.

The cover 203 may, for example, be a metallic lid. An aperture 205 in the substrate 202 provides a sound port and the flexible membrane of the transducer extends over the sound port.

The package will typically also contain electrical circuitry 204, customised for a particular application, which may be integrated with the MEMS die as shown in FIG. 2b or provided separately as shown in FIG. 2a. The integrated circuit may provide bias to the transducer and may buffer or amplify a signal from the transducer. According to convention, the configuration shown in FIGS. 2a and 2b—in which the sound port 205 is provided on same side of the package to the external electrical connection—is known as a "bottom port" configuration. It will be appreciated that the term "bottom port" does not imply any particular orientation of the package device either during manufacture, processing or any subsequent application.

According to the arrangements shown in FIGS. 2a and 2b the MEMS transducer is mounted such that the cavity 108 which extends through the substrate of the MEMS transducer forms part of the front volume. An electrically conductive path is provided from the electrodes of the MEMS transducer—which are provided at or near the top surface of the MEMS—to the circuitry (which may be integrated with the MEMS transducer or provided separately) and from the circuitry to an external electrical connection 208 provided on an external surface of the package. This is achieved via one or more wires 206 which extend between the circuitry and at least one electrical contact 207 e.g. bond pad provided on the upper surface 220 of the substrate. The electrical contact 207 is electrically connected from the upper surface 220 of the substrate to the external electrical connection 208 on the lower surface of the substrate.

Alternatively, in some arrangements as illustrated in FIG. 3, the MEMS transducer 201 may be mounted such that a first, top surface of the MEMS transducer is bonded to the package substrate and the cavity 108 of the transducer substrate forms part of the back volume. This configuration may be referred to as a "flip chip" configuration. It will be appreciated that if the electrical circuitry is provided separately rather than being integrated with the MEMS transducer as shown in FIG. 3, then the circuitry will also be arranged such that the opposite surface is bonded to the substrate.

Arrangements as illustrated in FIG. 3 potentially offer a number of electrical and mechanical advantages.

For example, it is known that bond wires within the MEMS package give rise to interference and may potentially cause a degradation in the RF and/or PSR performance of the transducer. By mounting the MEMS transducer in the manner illustrated in FIG. 3 so that the "top" surface of the MEMS 303 is mounted to the upper surface 320 of the package substrate, it is possible to shorten the electrical path between the circuitry and the electrical contact provided on the upper surface of the substrate, thereby reducing the length of, or potentially eliminating, the wires.

The package height may also be reduced as a consequence of such an arrangement since the minimum clearing between the top of the MEMS and the package lid need not allow space for the bondwires. Furthermore, any heat generated by the circuitry will be beneficially propagated into the package substrate. It will also be appreciated that the back volume of the transducer is increased since the transducer substrate cavity will form a part of the back volume. Increasing the back volume advantageously provides more control over the low frequency roll off of the microphone and also increases the microphone sensitivity due to decreased damping/stiffness in the back volume.

However, a problem that may be encountered with the flip-chip arrangement illustrated in FIG. 3 is that, during a process of adhering the top surface of the MEMS to the upper surface of the substrate, the bonding solution (e.g. glue or epoxy) may flow towards the transducer. Due to the orientation of the transducer, whereby the backplate and membrane layers are disposed in a plane more closely overlying the upper surface of the substrate than when the transducer is orientated as shown in FIG. 2, the bonding solution may potentially make contact with mechanically or acoustically critical regions of the MEMS transducer. It will be appreciated that the presence of the bonding solution in the MEMS transducer e.g. within the acoustic cavities and/or in contact with the flexible membrane transducer, may undermine the performance of the transducer.

It is therefore desirable to provide a way of inhibiting and/or controlling the flow of bonding solution from a region of application in a direction towards the MEMS transducer.

SUMMARY OF EMBODIMENTS

According to an example embodiment of a first aspect there is provided a MEMS device comprising a MEMS transducer, and a package substrate, wherein a top surface of the MEMS device is bonded to an upper surface of the package substrate at a bond region, wherein the MEMS transducer comprises:

a transducer substrate having a cavity which forms a cavity opening in an upper surface of the transducer substrate; and a flexible membrane supported so as to overlie the cavity, wherein the top surface of the MEMs device comprises a barrier region, the barrier region being at least partially provided laterally outside a region which overlies the cavity opening in the upper surface of the transducer substrate.

The barrier region may comprise one or more discontinuities in the surface of the MEMS device. Advantageously, the discontinuities serve to alter the epoxy wettability of the top surface of the MEMS device in the barrier region. Thus it is possible to define (die attach) wettable and non-wettable regions on the top surface of the MEMS device. Specifically, by providing one or more surface features or discontinuities it is possible to define epoxy non-wettable regions in which the flow of a liquid such as glue or bonding solution will be inhibited. Thus, during a process of adhering the MEMS device to a package substrate in an orientation in which the first outer surface is to be adhered to the upper surface of a package substrate, the discontinuities are beneficially configured and/or arranged so as to inhibit the flow of the liquid. Thus, it is possible to protect and/or substantially isolate the vulnerable transducer components from the liquid bonding solution.

The surface discontinuities formed in the barrier region may comprise a plurality of dimples, depressions, wells or recesses formed in the first outer surface of the MEMS device. The plurality of dimples or recesses may be considered to define a series of lower regions which are provided between adjacent higher regions in the upper surface of the transducer substrate. The dimples may be formed by depressing material e.g. by coining or impressing the upper top surface, or by selectively etching the first outer surface of the MEMS device to remove material. Thus, the barrier region may comprise a patterned region formed in the first outer surface of the MEMS device, wherein the patterned region comprises a plurality of dimples. As will be explained further below, the plurality of dimples can be considered to modulate the contact angle between the bonding solution and the surface of the MEMS device in the barrier region.

According to one example the MEMS transducer comprises a backplate. The flexible membrane may be interposed between said backplate and the cavity, wherein the backplate overlies the cavity. It may be beneficial for the barrier region to be formed in at least one layer of material which is deposited to form the backplate. Typically, the backplate comprises a plurality of holes which extend through the backplate. The barrier region may advantageously comprise discontinuities, e.g. dimples or wells, which are formed during one or more processing steps to form the plurality of holes in the backplate. Preferably, the barrier region is provided laterally outside a region which overlies the backplate.

According to an example embodiment of a second aspect there is provided a MEMS device comprising a MEMS transducer, wherein the MEMS transducer comprises:
a substrate having a cavity;
a backplate which overlies the cavity,
a flexible membrane interposed between the backplate and the cavity,
a barrier region provided on a top surface of the MEMs device, laterally outside a region which forms, or overlies, the backplate.

According to an example embodiment of a third aspect there is provided an assembly comprising a MEMS device, comprising a MEMS transducer, and a package substrate, wherein a top surface of the MEMS device is bonded to the upper surface of the package substrate at a bond region. Thus, the assembly may form a flip-chip bonded MEMS assembly. A lid may be further provided to form a package.

The flexible membrane of the transducer preferably overlies a sound port provided with the substrate. The bond region preferably forms an acoustic seal between the sound port and the MEMS transducer. The barrier region may be provided laterally inside the bond region. The barrier region may be considered to define a ring which substantially encircles a region overlying the transducer.

According to an example embodiment of a fourth aspect there is provided a method of fabricating a MEMS device comprising a capacitive transducer, the transducer comprising a substrate, the substrate having a cavity, the method comprising:
providing a flexible membrane which overlies the cavity;
forming a barrier region on a top surface of the device.

The step of forming a barrier region on a top surface of the device may comprise patterning a region laterally outside a region overlying the flexible membrane. The patterning may involve patterning a layer which also forms at least one layer of a backplate structure of the capacitive transducer.

BRIEF DESCRIPTION OF THE FIGURES

For a better understanding of the present invention, and to show how the same may be carried into effect, reference will now be made by way of example to the accompanying drawings in which.

FIGS. 4a and 4b provide a schematic illustration and a plan view, respectively, of a MEMS device 300 according to a first example embodiment. The MEMS device comprises a MEMS transducer having a flexible membrane 301 supported with respect to a substrate 305 so as to overlie a cavity 308 formed through the substrate. A first outer (top) surface 303 of the MEMS device is provided with a barrier region B. Although not illustrated in the FIG. 4 example, the transducer will typically further comprise a rigid structure or backplate which is disposed on the opposite side of the membrane to the substrate 305 so as to overly the substrate cavity. The backplate will typically support a fixed electrode, wherein the fixed electrode forms one of a capacitive pair of electrodes of the transducer. Furthermore, although not illustrated in the FIG. 4 example, the flexible membrane is typically provided with a membrane electrode, wherein the membrane electrode will be moveable as part of a membrane structure in response to acoustic pressure differentials across the membrane.

The first outer surface 303 is typically referred to as the "top" surface of the MEMS device. The substrate cavity 308 extends through the substrate from a bottom surface of the substrate to a top surface of the substrate and the membrane 301 is flexibly supported in a plane overlying the cavity 308. It will be appreciated that the MEMS device may be flipped to an upside down orientation for attachment to the package substrate in use and, as such, the relative term "top" should be construed accordingly. Similarly, it will be appreciated that references to the region "overlying" the cavity should be interpreted having regard for the MEMS device in an orientation in which the first outer surface 303 forms a top or upper surface of the device.

In this example, the barrier region B region is located laterally outside the region C overlying the cavity opening in the top surface of the substrate. Depending on the specific design of the MEMS device, including e.g. the width and shape of the underlying cavity and also of the top surface of the MEMS device, it will be appreciated that the barrier region B could extend a partially over the cavity. Preferably, however, the barrier region does not extend into a region overlying a central region of the cavity. The barrier region also preferably does not extend into a region overlying the membrane 301 of the transducer. The location of the barrier region laterally outside a region overlying the opening in the upper surface of the cavity beneficially serves to ensure that during a process of adhering the top surface of the MEMS device to a package substrate, for example, the flow of bonding solution or glue towards and/or into the acoustic cavities of the transducer is inhibited.

Examples are also envisaged within the context of the presented disclosure in which the barrier region may be provided so as to laterally surround one or more electrical contact e.g. bond pad provided on the upper surface of the substrate for electrically connect the circuitry (ASIC) to an external electrical contact. Thus, it is possible to alleviate the risk of the electrical contact becoming contaminated with bonding solution by forming a barrier region at a distance laterally outside the region of the contact, wherein the barrier is configured to inhibit the flow of liquid (e.g. bonding solution) towards the electrical contact. Furthermore, in the case of an integrated die for example, a barrier region may be provided on a top surface of the ASIC to contain die attach in specific areas allow for more effective heat management. It is possible for heat conductive epoxy to be used to allow a more efficient heat transducer into the package substrate.

Figure 5A:
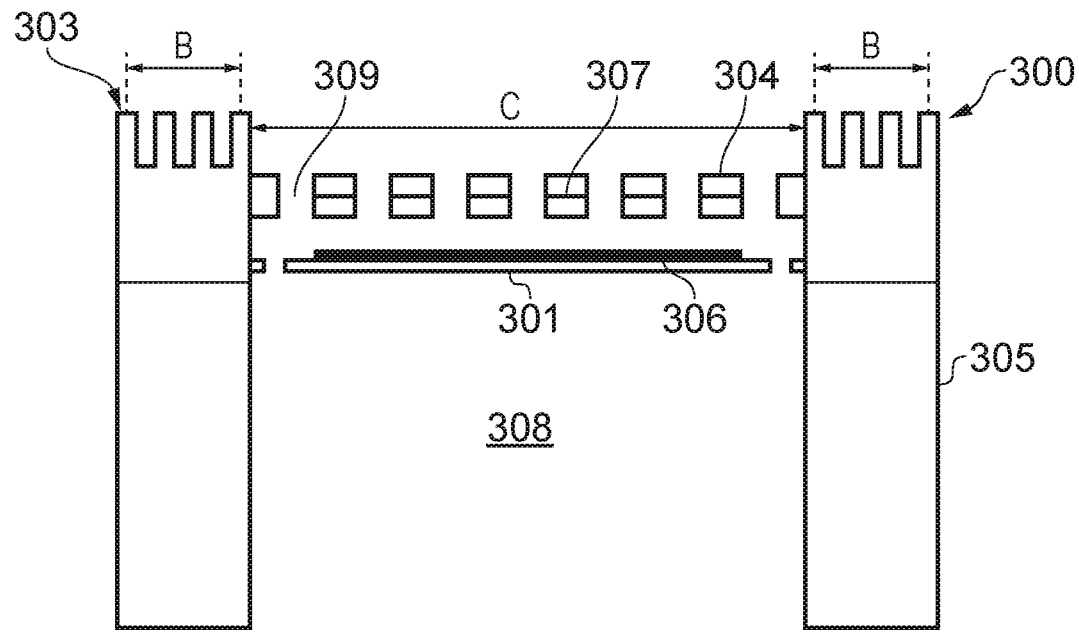
FIGS. 5a and 5b provide a schematic illustration and a plan view, respectively, of a MEMS device according to a second example embodiment.
Figure 5B:
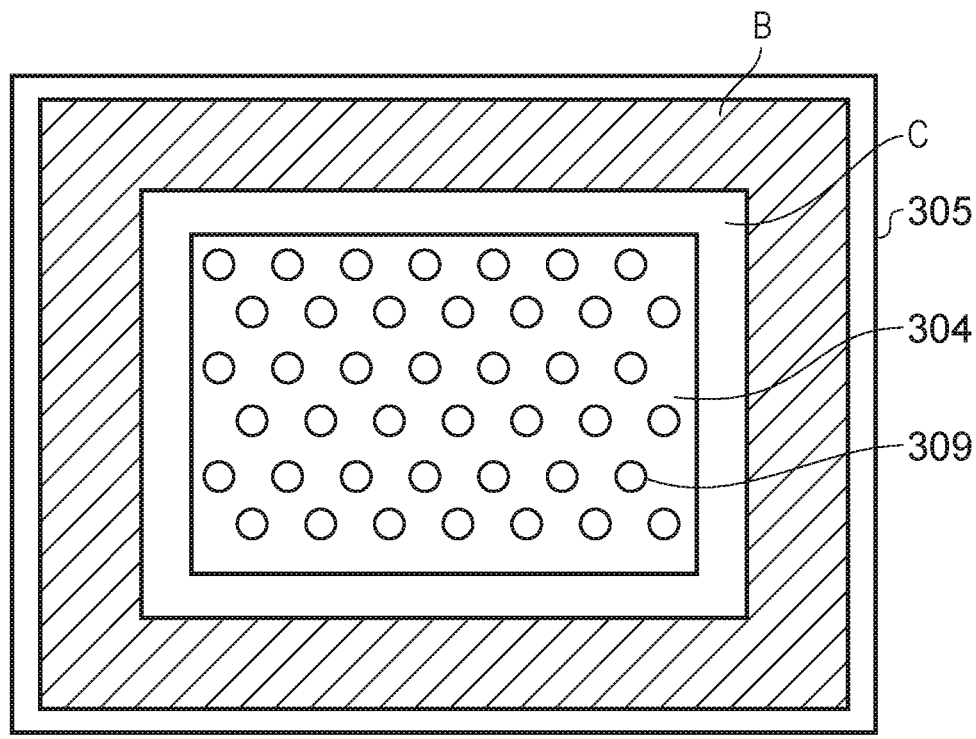

FIGS. 5a and 5b provide a schematic illustration and a plan view, respectively, of a MEMS device 300 according to a second example embodiment. The MEMS device comprises a MEMS transducer having a flexible membrane 301 supported with respect to a substrate 305 so as to overlie a cavity 308 formed through the substrate. The flexible membrane comprises a membrane electrode 306. The MEMS transducer further comprises a rigid backplate 304 which is disposed on the opposite side of the membrane to the substrate 305, so as to overly the substrate cavity. The backplate structure comprises a plurality of acoustic holes 309. Embedded within the backplate structure 304 is a fixed electrode 307. A barrier region B is provided on a first outer surface 303 of the MEMS device.

In this example, the barrier region B region is located laterally outside a region overlying the backplate 304 such that the barrier region and the backplate do not overlap. The barrier region is also provided in a plane above the plane of the backplate structure. Thus, the backplate and the barrier region may be considered to be mechanically decoupled from each other, which may beneficially minimise the transfer of stress between the two structures.

The flexible membrane region of the MEMS transducer may be considered to be the active region of the membrane that is defined by the manner in which a membrane layer is supported relative to the substrate. It will be appreciated that the membrane layer may be square or rectangular in shape, for example, whilst the flexible membrane region may be generally circular or cow-hide shaped.

The present examples consider the lateral (x/y-coordinates) location of a barrier region formed on a top surface of the MEMS device, relative to the lateral (x/y-coordinates) location of other components or features of the MEMS device that may be provided in a different plane or layer (i.e. a different z-coordinate) of the device.

Thus, in effect, in order to consider the relative lateral positions it may be convenient to consider the location of a barrier region on the top surface of a MEMS device with respect to the positions of one or more of the transducer components, such as the flexible membrane, the backplate structure or the transducer cavity, when projected onto the x/y plane of the top surface. This is more clearly illustrated by FIGS. 3b and 4b which respectively illustrate plan views of the transducers shown in FIGS. 3a and 4a.

Figure 3:
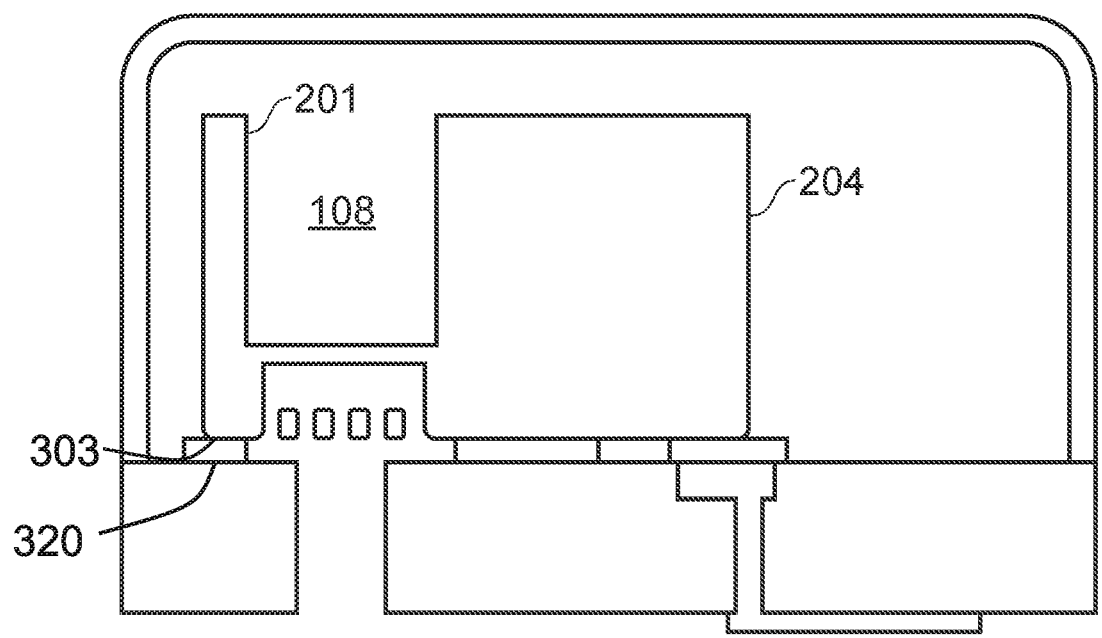
FIG. 3 illustrates a further MEMS transducer package.
Figure 4A:
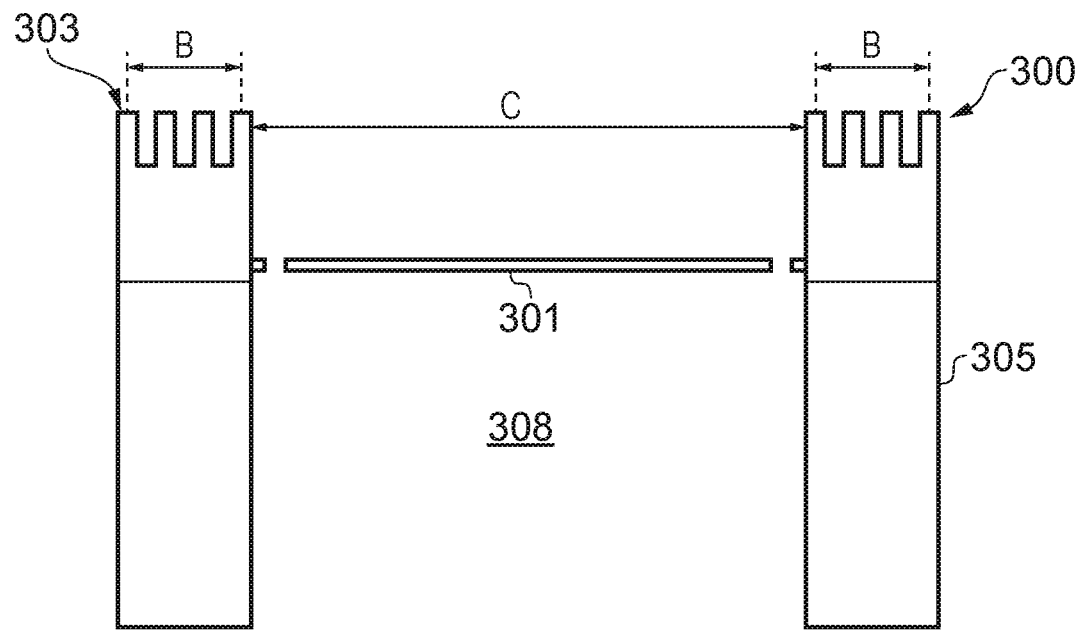
FIGS. 4a and 4b illustrate a schematic cross-sectional view and a plan view respectively of a MEMS device according to a first example.
Figure 4B:
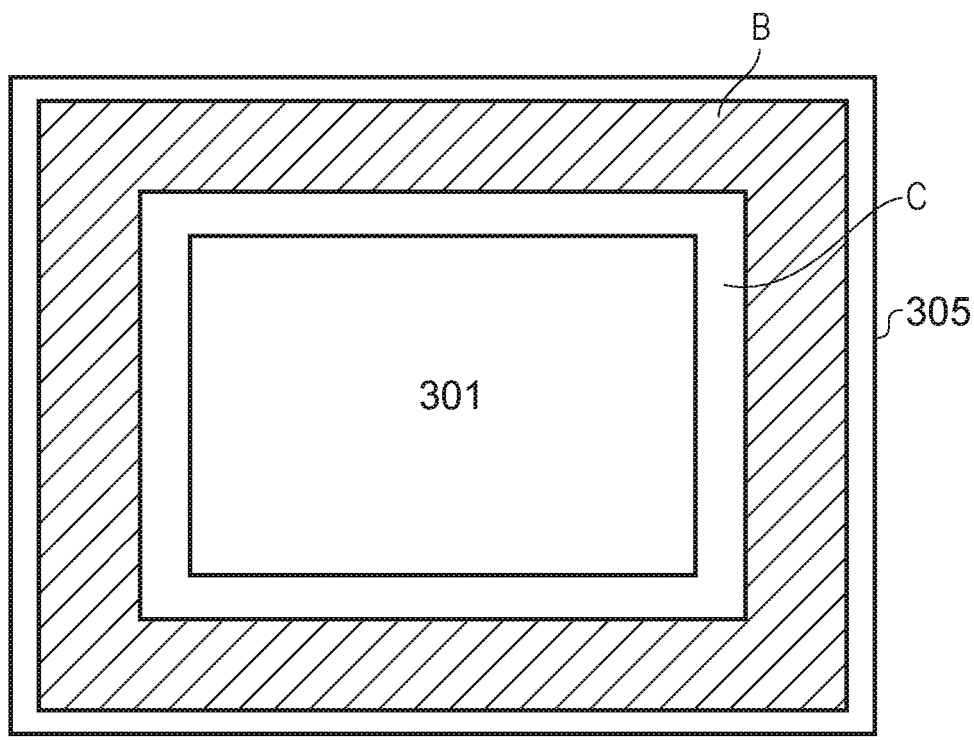

As illustrated in FIGS. 3b and 4b, when the components of the transducer are visualised as a projection onto the plane of the top surface of the MEMS device, the barrier region B can be considered to laterally surround the MEMS transducer—in particular the acoustic cavities of the transducer, the flexible membrane and the backplate (if provided). Thus, the barrier region can be considered to define a substantially continuous ring or loop provided on the top surface of the MEMS device which encircles a notional region in the same plane as the top surface of the MEMS device which overlies (or is overlapping with) the mechanically and acoustically important regions of the transducer. During a subsequent process of adhering the top surface of the MEMS device to a package substrate, the provision of a barrier region which is formed so as to surround or encircle a region overlying the backplate, beneficially mitigates the potential for bonding solution to flow towards the backplate and/or to contaminate the transducer. In particular, it will be appreciated that the MEMS device should ideally be bonded to the substrate in such a way as to create an acoustic seal between the acoustic port in the package substrate and the MEMS transducer. This is to allow effective acoustic wave transfer to the membrane without air leakage around it into the back volume. To achieve this preferably requires a layer of adhesive to be applied to the top surface of the MEMS device so as to define a ring (which may be square/rectangular, circular or any other shape) which substantially encircles a region overlying the transducer structure. Thus, to act as an effective barrier between the region of application of the adhesive and a region overlying the transducer, the barrier region preferably forms a continuous ring (which, again, may be substantially square/rectangular shaped, circular or any other shape) which is provided laterally inside an intended region of application of the bonding solution on the top surface of the MEMS device, i.e. between the intended region of application of the bonding solution and a region overlying the transducer structure.

The barrier region may comprise one or more discontinuities in the surface of the MEMS device. Advantageously, the discontinuities serve to alter the wettability of the top surface of the MEMS device in the barrier region. Thus it is possible to define wettable and non-wettable regions on the top surface of the MEMS device. Specifically, by providing one or more surface features or discontinuities it is possible to define epoxy non-wettable regions in which the flow of a liquid such as glue or bonding solution will be inhibited. Thus, during a process of adhering the MEMS device to a package substrate in an orientation in which the first outer surface is to be adhered to the upper surface of a package substrate, the discontinuities are beneficially configured and/or arranged so as to inhibit the flow of the liquid. Thus, it is possible to protect and/or substantially isolate the vulnerable transducer components from the liquid bonding solution. Further detailed explanation of this will be provided in relation to the assembly illustrated in FIG. 9.

The surface discontinuities formed in the barrier region may comprise a plurality of dimples, depressions or recesses formed in the first outer surface of the MEMS device. The plurality of dimples or recesses may be considered to define a series of lower regions which are provided between adjacent higher regions in the upper surface of the transducer substrate. The dimples may be formed by depressing material e.g. by coining or impressing the upper top surface, or by selectively etching the first outer surface of the MEMS device to remove material. Thus, the barrier region may comprise a patterned region formed in the first outer surface of the MEMS device, wherein the patterned region comprises a plurality of dimples. As will be explained further below, the plurality of dimples can be considered to modulate the contact angle between the bonding solution and the surface of the MEMS device in the barrier region.

Figure 6A:
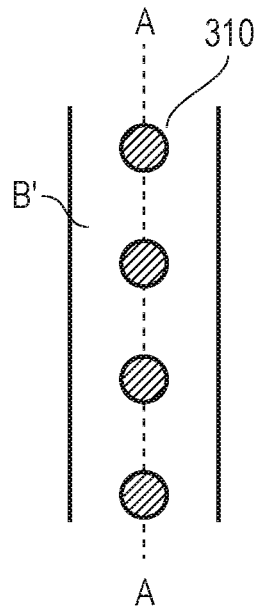
FIGS. 6a to 6h illustrate various examples of the shape and configuration of surface discontinuities that may be provided in a barrier region.
Figure 6B:
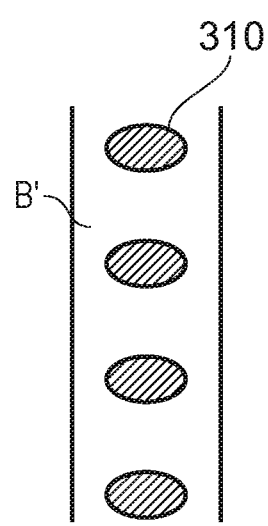
Figure 6C:
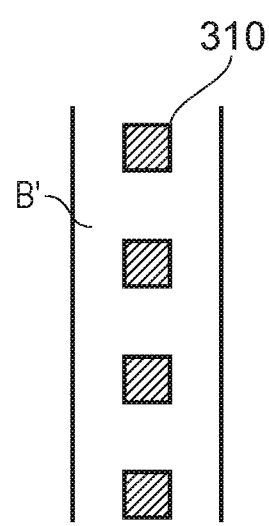
Figure 6D:
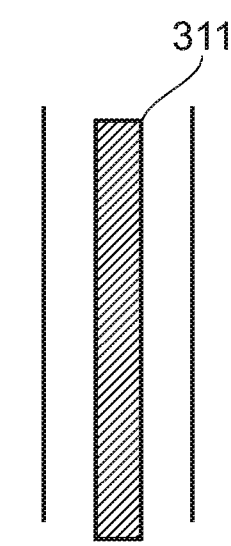
Figure 6E:
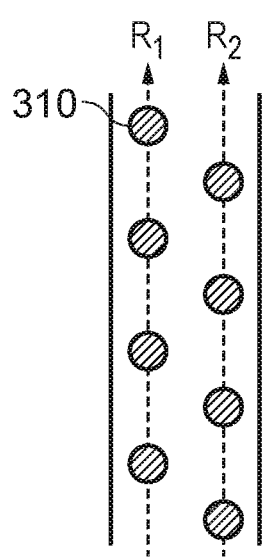
Figure 6F:
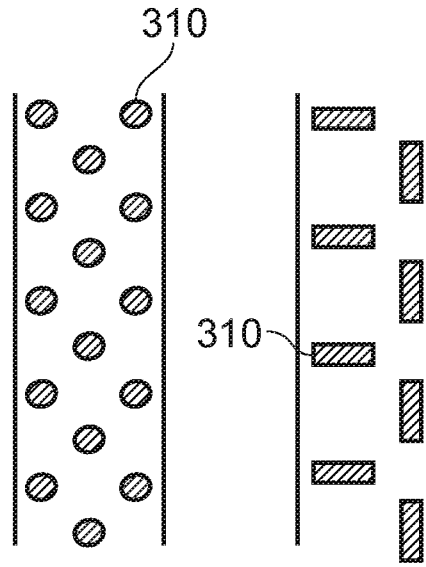
Figure 6G:
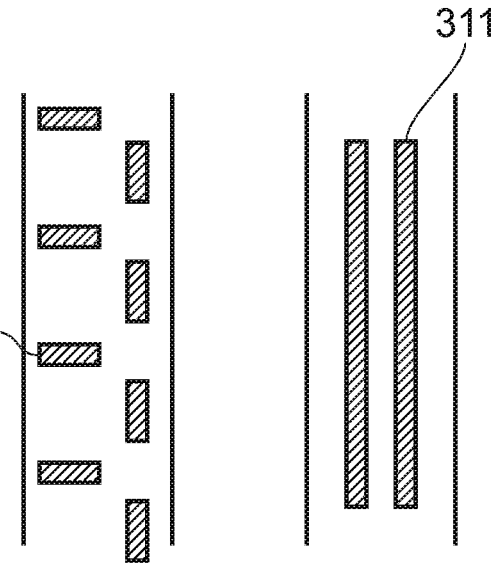
Figure 6H:
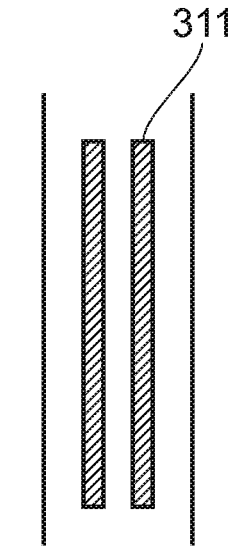

FIGS. 6a to 6h illustrate a part of a barrier region B' in order to illustrate various examples of the shape and configuration of a surface discontinuities that may be provided in a barrier region, according to examples described herein. Thus, FIG. 6a shows a plurality of dimples 310 which occupy an area having a substantially circular shape. FIG. 6b shows a plurality of dimples 310 which occupy an area having a generally oval shape, and FIG. 6c shows a plurality of generally square-shaped dimples. In each of FIGS. 6a to 6c the dimples 310 are arranged to form a single row of dimples, wherein the row is substantially parallel to a longitudinal boundary of the barrier region B'.

Figure 7A:
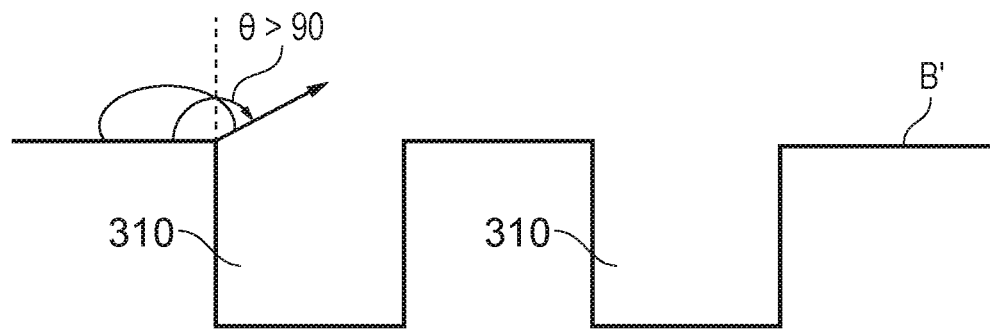
FIGS. 7a and 7b illustrate various magnified cross-sectional profiles of a part of a row of dimples.
Figure 7B:
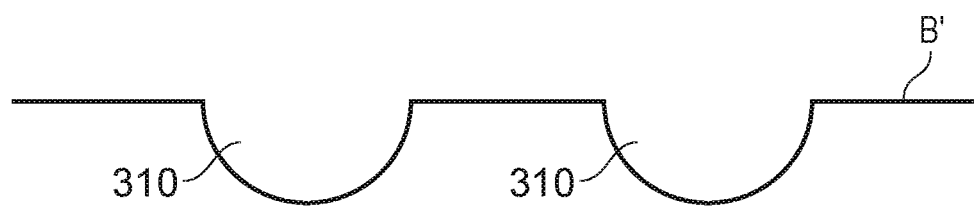

FIGS. 7a and 7b illustrate various magnified cross-sectional profiles (e.g. through a line A-A shown in FIG. 4a) of a part of a row of dimples. As illustrated in FIG. 7a, the dimples 310 may exhibit a uniform depth and may exhibit a disk shape with a substantially square shaped profile. As illustrated in FIG. 7b the dimples 310 may exhibit a non-uniform depth and may exhibit a substantially dome shape.

Figure 8:
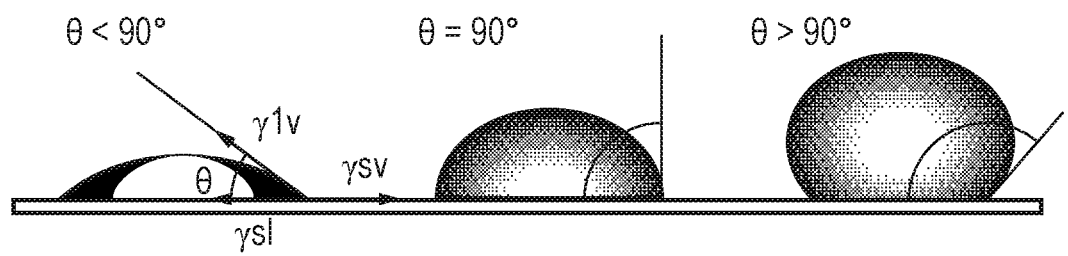
FIG. 8 illustrates droplet profiles to illustrate the contact angle between a droplet and a surface.

In order to understand the way in which the discontinuities e.g. the dimples or trenches formed in the barrier region may function so as to inhibit the flow of a liquid such as bonding solution or glue reference is made to FIG. 8. In particular, the discontinuities may advantageously serve to alter the so-called "wettability" of the surface of the MEMS by altering the contact angle between the liquid and the first outer surface of MEMS device. From consideration of the droplet profiles shown in FIG. 8, the contact angle $\Theta$ can be defined as the angle formed by the intersection of the liquid-solid interface and the liquid-air interface. Thus, for a contact angle $\Theta<90°$, the surface can be considered to exhibit a surface which is "hydrophilic" characteristic. In other words, the conditions for wetting of the surface are favourable and the droplet will spread on the surface. However, for a contact angle $\Theta>90°$, the surface can be considered to show a hydrophobic characteristic. In other words, the conditions for wetting of the surface are unfavourable and the liquid will tend to minimise its contact with the surface and form a compact droplet.

This theory can be used to explain the advantages associated with examples described herein.

Thus, with reference to FIG. 7a, it can be appreciated that the provision of a dimple 310 (or indeed a trench or groove 311) in the top surface of the MEMS device renders the top surface resistant to the flow of liquid beyond the edge of the dimple. It will be appreciated that although the dimple 310 will tend to resist the flow of bonding solution beyond the first edge of the dimple, there may come a point at which the bonding solution will nonetheless flow past the first edge and into the dimple. Since the dimple may not provide a sufficient reservoir for the bonding solution, the bonding solution may continue to flow beyond the dimple. For this reason, it may be beneficial to provide a plurality of rows of dimples e.g. 2 to 20 rows of dimples in the barrier region. The rows may advantageously be staggered or lineally offset with respect to an axis parallel to the row direction R1, in order that liquid travelling in a direction substantially orthogonal to the row direction will encounter at least one dimple.

The dimples may preferably exhibit a width of between 0.5 μm and 2 μm. The maximum depth of the dimples may preferably be between 0.5 um and 1 um microns.

Figure 9:
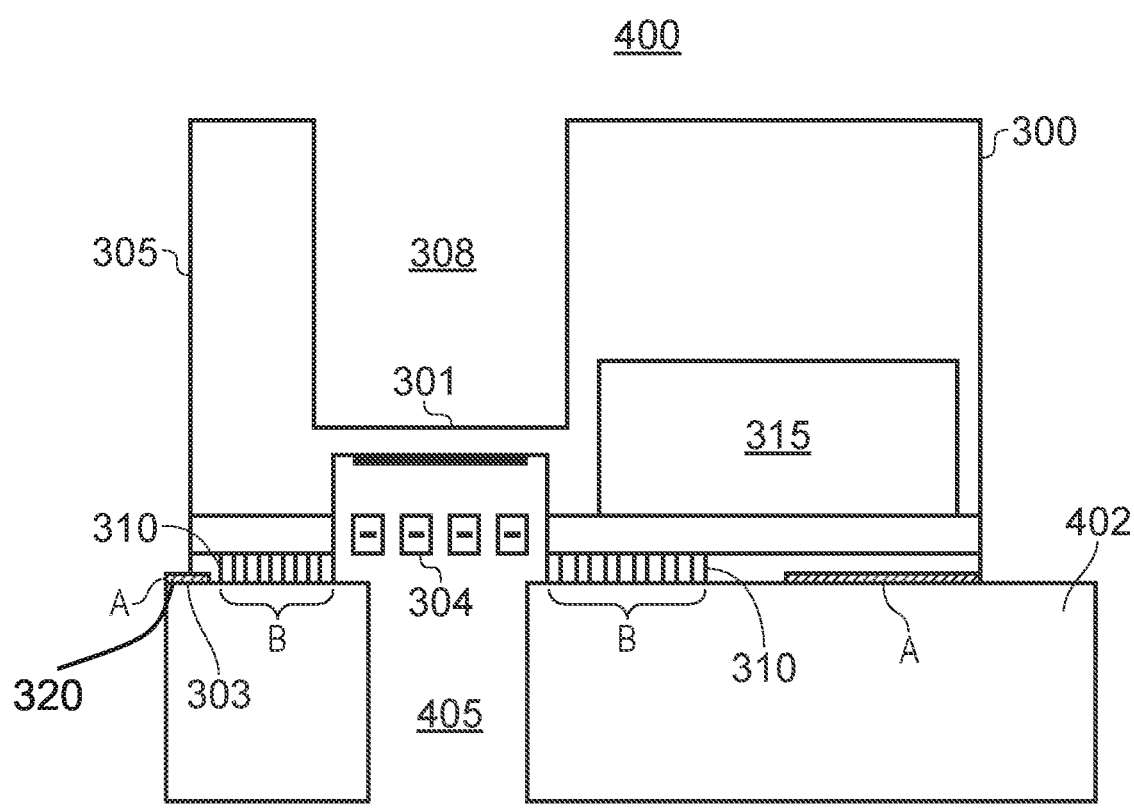
FIG. 9 illustrates an assembly according to a third example embodiment.

FIG. 9 illustrates an assembly 400 comprising a MEMS device 300 and a part of a package substrate 402. An aperture 405 in the substrate 402 provides a sound port. The MEMS device 300 comprises a MEMS transducer structure, comprising a membrane 301 supported relative to a cavity 308 provided in the transducer substrate 305 and having an integrated circuitry region 307 (e.g. ASIC). In this arrangement, the MEMS device is orientated such that a top surface 303 of the MEMs device is bonded to the upper surface 320 of the package substrate 402. The top surface of the MEMS device is provided with a barrier region B comprising a plurality of dimples.

The barrier region comprises a plurality of dimples 310 which serve to alter the wettability of the top surface of the MEMS device in the barrier region. The barrier region forms a continuous ring on the top surface of the MEMS device and is provided in a region laterally outside a notional region overlapping with the backplate. The barrier region is provided in a region laterally inside a region A where bonding solution (e.g. epoxy) is applied in order to bond/adhere the MEMS top surface to the package substrate. The region A defines a ring which substantially encircles a region overlying the transducer structure. Thus, to act as an effective barrier between the region of application of the adhesive and a region overlying the transducer, the barrier region preferably defines an area in the shape of a continuous ring which is provided laterally inside the region A on the top surface of the MEMS device, i.e. between the intended region of application of the bonding solution and a region overlying the transducer structure.

The dimples 310 advantageously serve to define a non-wettable barrier region on the top surface of the MEMS device. Thus, during a process of adhering the MEMS device 300 to the package substrate 400 in an orientation in which the first outer surface 303 is bonded to the upper surface of a package substrate, the discontinuities are beneficially configured and/or arranged so as to inhibit the flow of the liquid adhesive from the region A towards the transducer structure.

The bonding solution may for example be epoxy solution. The bonding solution may be applied such that a seal is formed between the top surface of the MEMS and the upper surface of the package substrate. The seal, which may be considered to be an acoustic seal, ensures that acoustic waves are effectively transferred to the membrane of the MEMS transducer from outside the package, without any significant air leakage at the junction between the MEMS transducer and the substrate.

In this example, the MEMS device comprises integrated electronic circuitry 315. It will be appreciated that the barrier region may be extended onto a region of the top service of the device which overlaps with the circuitry 315.

The top surface of the MEMS transducer may be formed of a material such as silicon, silicon nitride ($Si_3N_4$), polysilicon or metal (e.g. AlSi). Thus, according to one example, the barrier region is formed by patterning a region of a deposited layer of material e.g. silicon nitride. The layer of material that forms the barrier region may be beneficially formed from a layer that is deposited to form at least one layer of the backplate structure. It will be appreciated, however, that due to the topology of the top surface of the MEMS device, which reflects underlying layers or structures, there may be at least one step change between the material that forms the backplate and the material that forms the barrier region on the top surface of the device.

FIGS. 10a to 10f illustrate a possible method of fabricating a MEMs die comprising a MEMS transducer comprising a membrane 501 and electrical circuitry 515 integrated with the MEMS die.

Figure 10A:
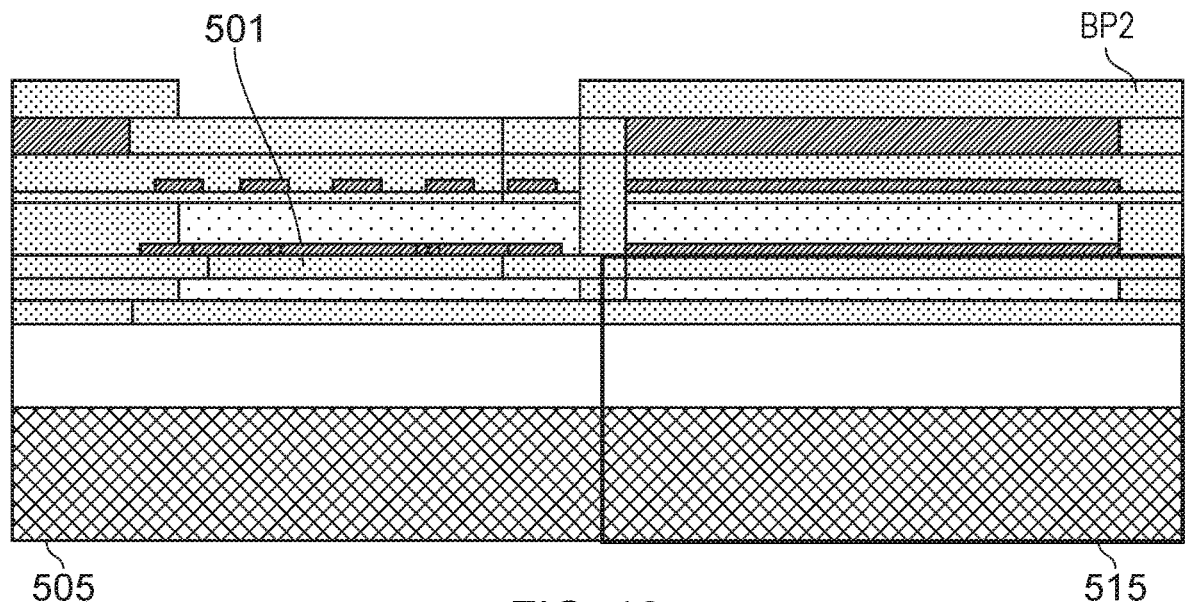
FIGS. 10a to 10f are schematic cross sectional views illustrating a possible fabrication process for a MEMS device according to a first example method.

FIG. 10a illustrates a stage in the fabrication of the MEMS die prior to the formation of a cavity in the substrate 505 and the removal of sacrificial layers of material which are shaded with dots for the purposes of this illustration.

Figure 10B:
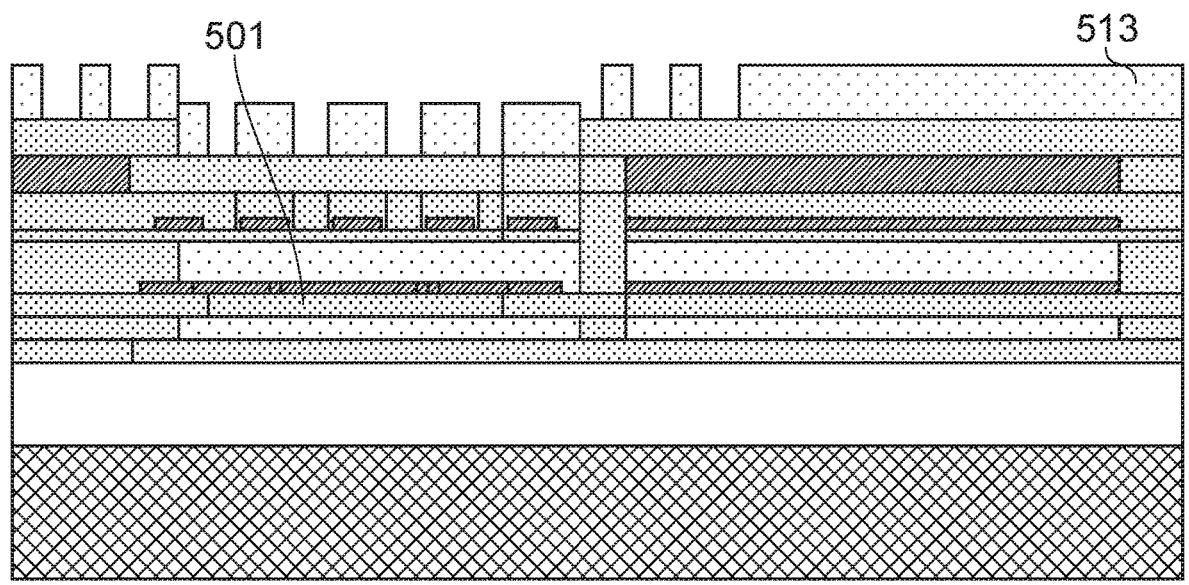

As illustrated in FIG. 10b a layer of sacrificial material 513—e.g. polyimide—is deposited on top of one of the layers BP2 that is deposited to form the eventual backplate structure of the MEMS device. The backplate layer BP2 will typically be silicon nitride. The layer 513 is patterned using a pattern mask layer in order to define the dimples to be provided in the barrier region, and also the acoustic holes that will be formed within the backplate structure.

This represents an efficient and cost-effective adaptation to standard processing in order to provide a barrier region which provides a number of technical benefits and advantage to the MEMS device. In particular, the vulnerable transducer components, including the acoustic cavities and moveable membrane, are protected from ingress of bonding solution during a subsequent process of bonding the top surface of the MEMS device to a package substrate.

Figure 10C:
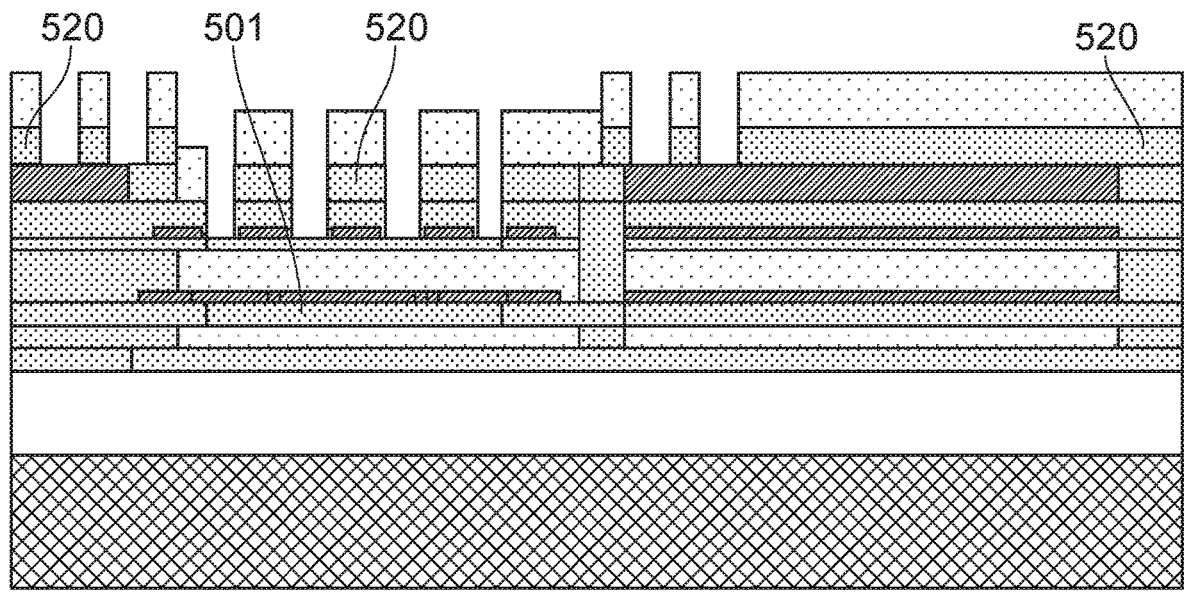

An etch is then performed from within the regions of the layer BP2 that are beneath the patterned sacrificial layer being protected from the etching process, thus resulting in a patterned silicon nitride layer 520 as shown in FIG. 10c. The etch is performed down to the sacrificial layer that defines the airgap between the membrane and the backplate structure.

Figure 1A:
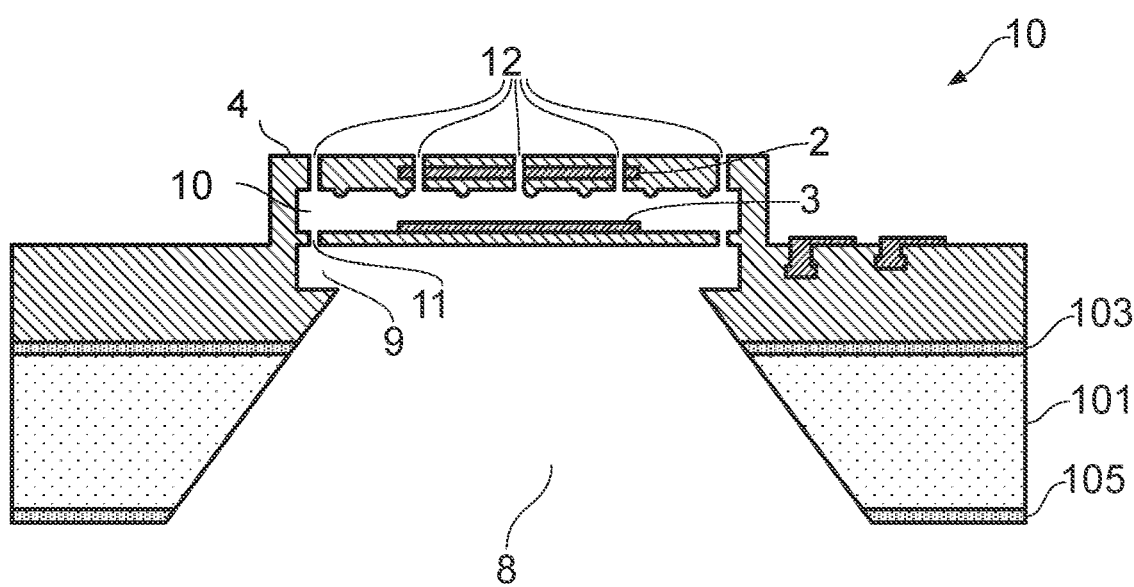
FIGS. 1a and 1b illustrate a schematic cross-sectional view and cutaway perspective view respectively of a MEMS microphone
Figure 1B:
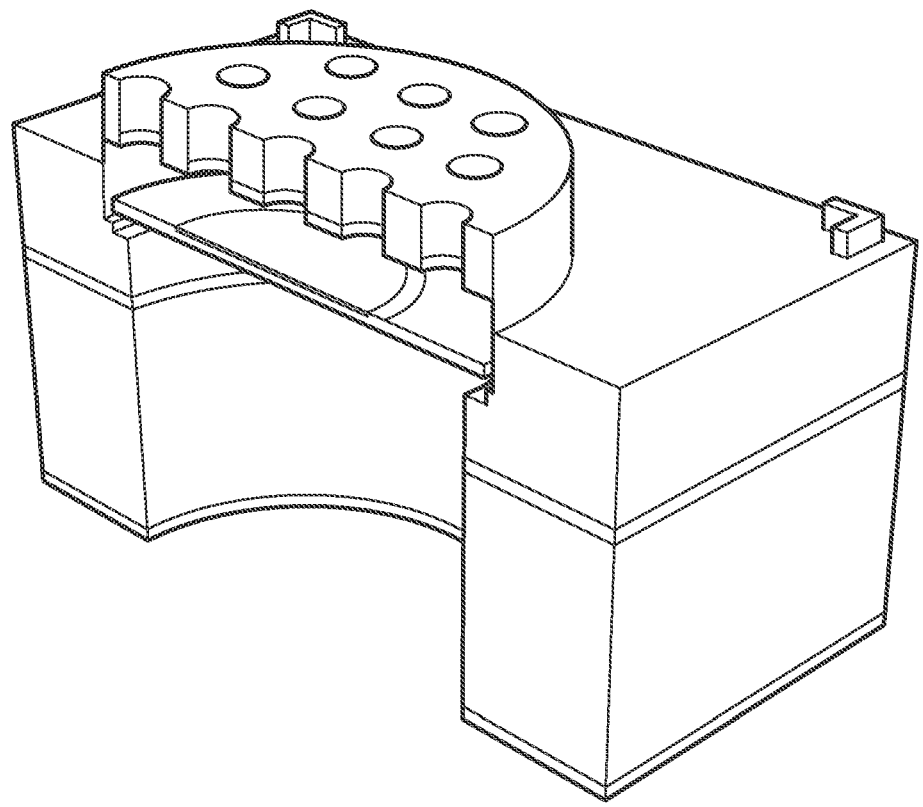
Figure 2A:
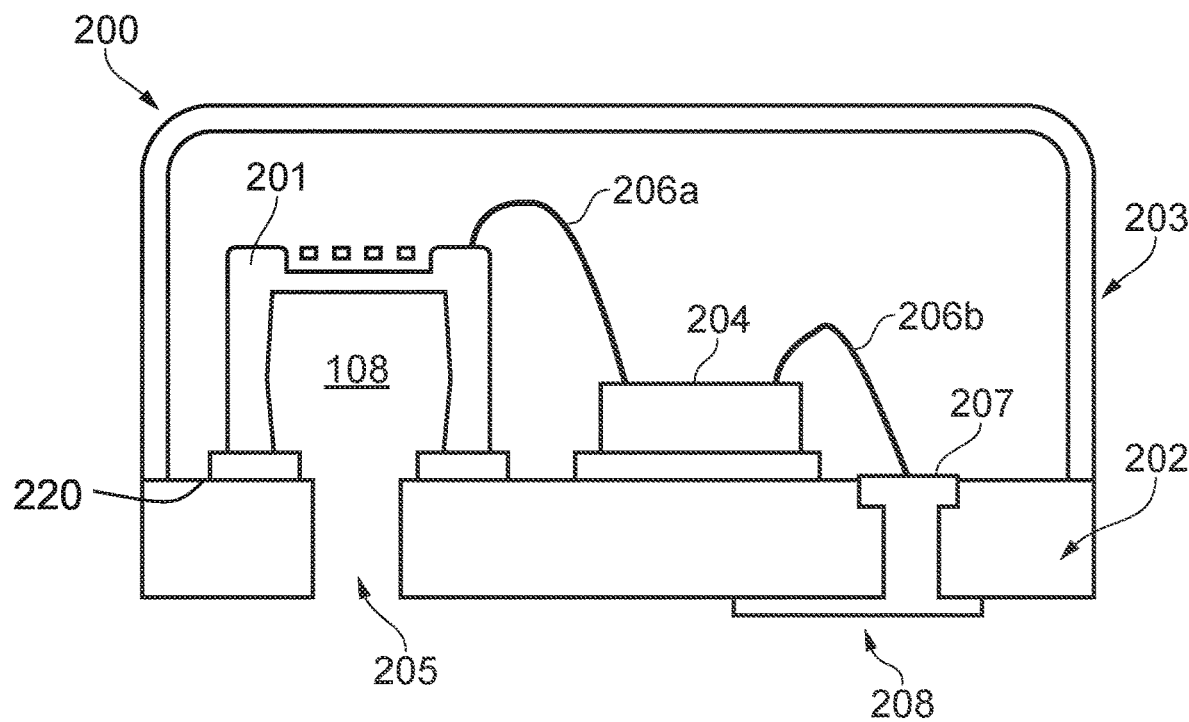
FIGS. 2a and 2b illustrate MEMS transducer packages.
Figure 2B:
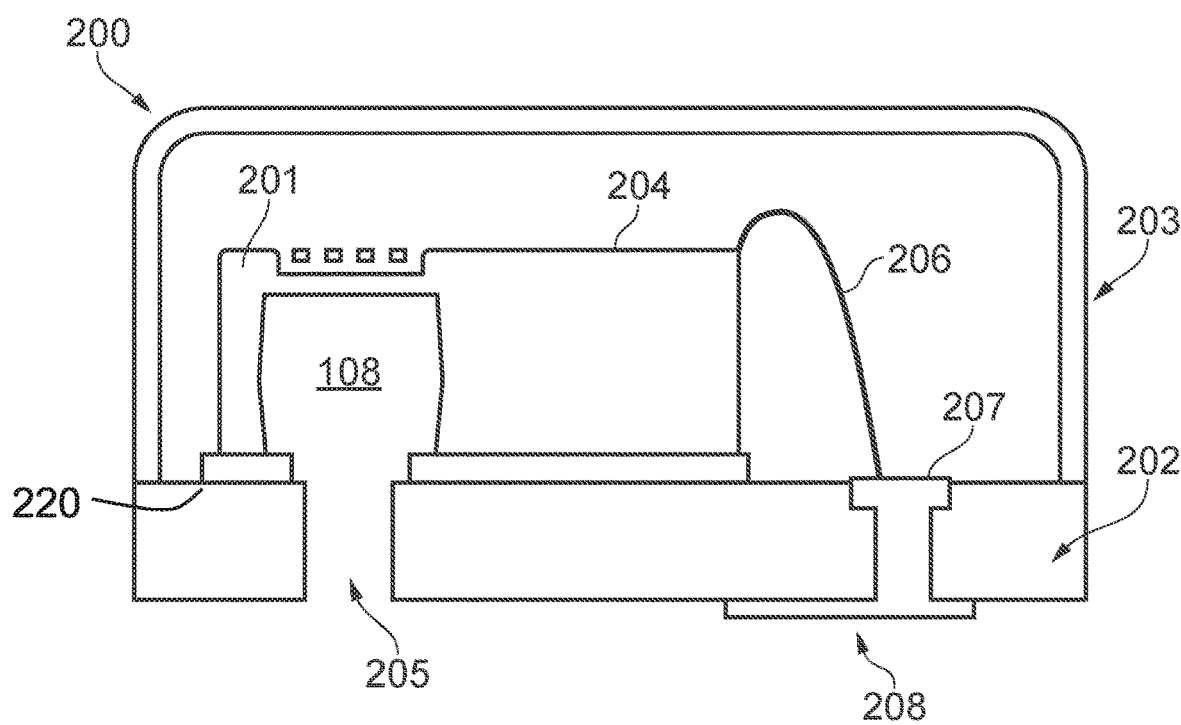
Figure 10D:
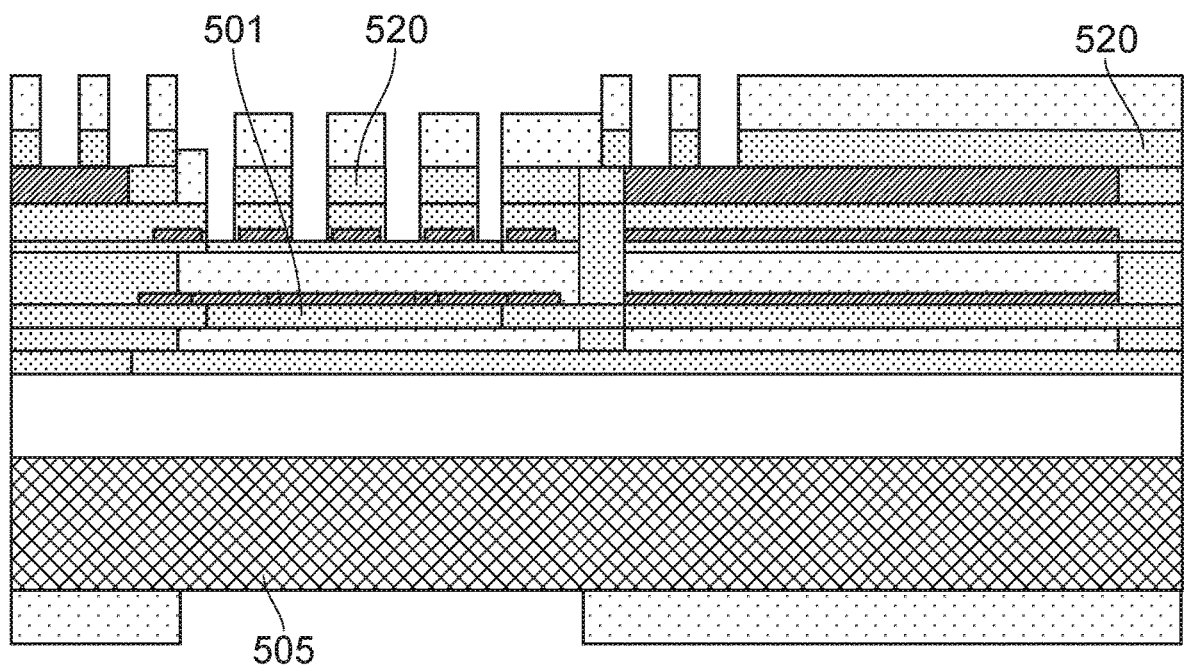
Figure 10E:
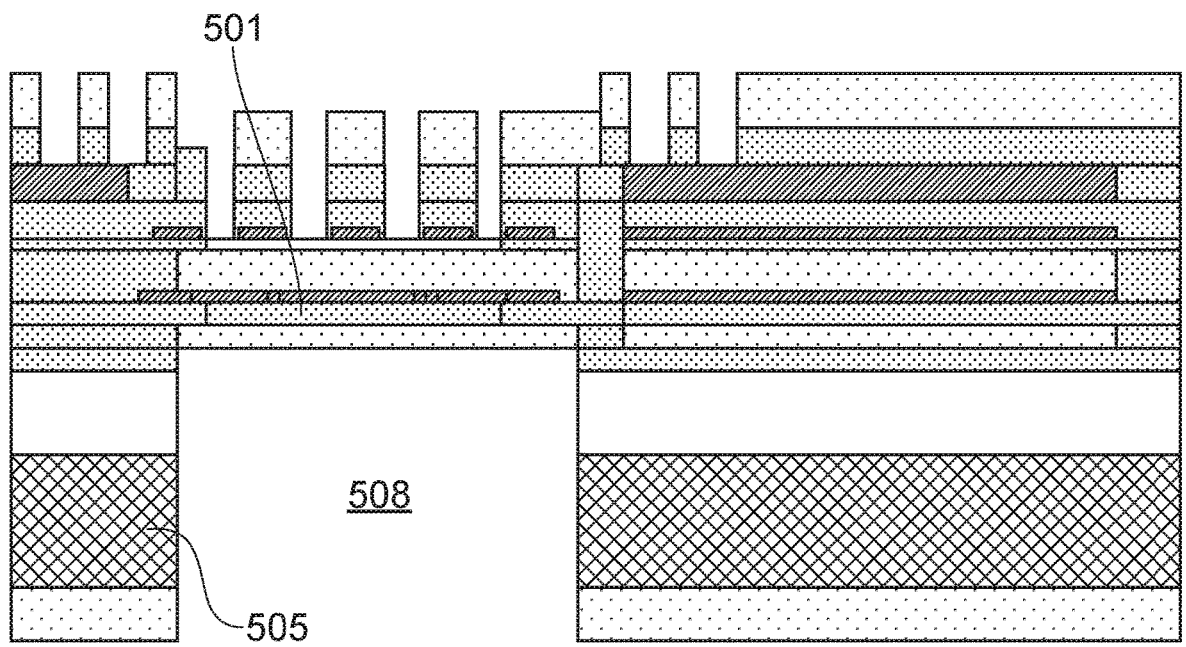

As illustrated in FIGS. 10d and 10e, a back-volume is formed in the substrate by etching from underneath the substrate. The etching may be performed using a wet-etch up to a first etch stop layer provided beneath the membrane 501. For ease of illustration, the sides of the back-volume shown in FIG. 10e have been shown to be parallel. However, it will be appreciated that the sides of the back volume will tend to converge inwards as they approach the membrane, as shown in the more realistic illustration in FIG. 1.

Figure 10F:
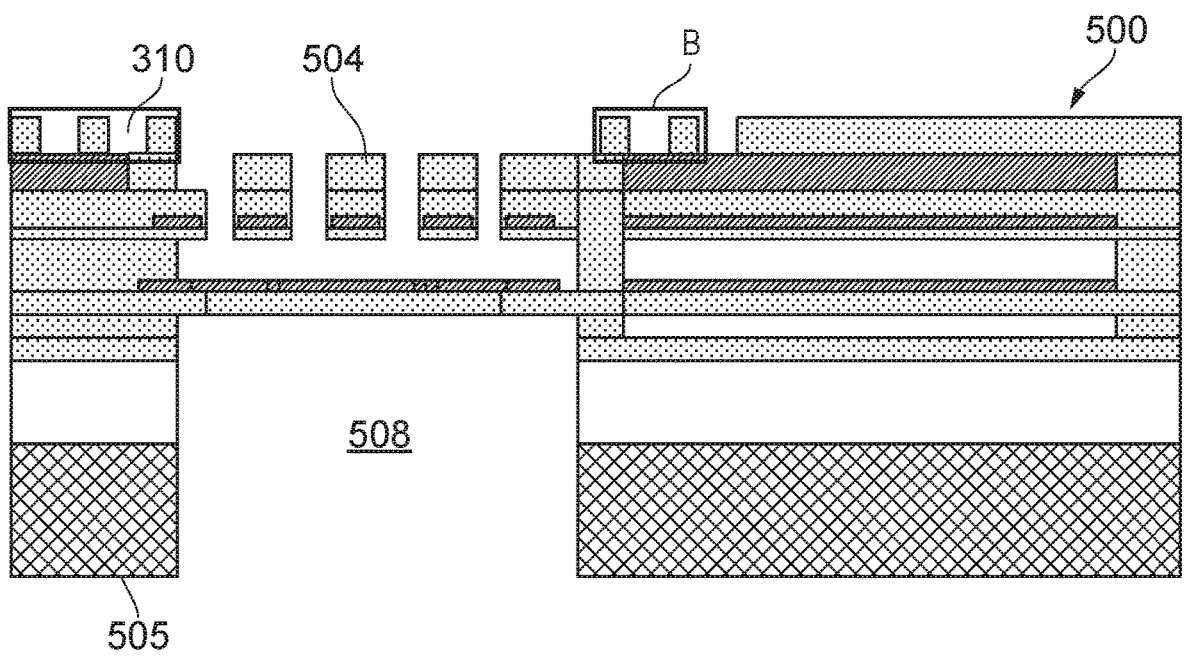

Finally, removal of all of the sacrificial layers takes place to produce the MEMS transducer as shown in FIG. 10f. Thus, FIG. 10f illustrates a MEMS device 500 according to a third example embodiment, wherein a top surface of the device is provided with a barrier region B comprising a plurality of dimples 310 in addition to a backplate 504. FIGS. 10e and 10f also illustrate a cavity 508 which extends through the substrate of the MEMS transducer.

It should be understood that the various relative terms upper, lower, top, bottom, underside, overlying, beneath, etc. that are used in the present description should not be in any way construed as limiting to any particular orientation of the MEMS transducer within a package or during any fabrication step and/or its orientation in any device or apparatus. Thus the relative terms shall be construed accordingly. The flexible membrane layer of a MEMS transducer generally comprises a thin layer of a dielectric material—such as a layer of crystalline or polycrystalline material. The membrane layer may, in practice, be formed by several layers of material which are deposited in successive steps. The flexible membrane may, for example, be formed from silicon nitride $Si_3N_4$ or polysilicon. Crystalline and polycrystalline materials have high strength and low plastic deformation, both of which are highly desirable in the construction of a membrane. The membrane electrode of a MEMS transducer is typically a thin layer of metal, e.g. aluminium, which is typically located in the centre of the membrane, i.e. that part of the membrane which displaces the most. It will be appreciated by those skilled in the art that the membrane electrode may be formed by an alloy such as aluminium-silicon for example. The membrane electrode may typically cover, for example, around 40% of area of the membrane, usually in the central region of the membrane. Thus, known transducer membrane structures are composed of two layers of different material—typically a dielectric layer (e.g. SiN) and a conductive layer (e.g. AlSi).

In some applications the backplate may be arranged in the front volume, so that incident sound reaches the membrane via the acoustic holes in the backplate. In such a case the substrate cavity may be sized to provide at least a significant part of a suitable back-volume. In other applications, the microphone may be arranged so that sound may be received via the substrate cavity 108 in use, i.e. the substrate cavity forms part of an acoustic channel to the membrane and part of the front volume. In such applications the backplate 104 forms part of the back-volume which is typically enclosed by some other structure, such as a suitable package.

It should also be noted that whilst the illustrated examples show the backplate being supported on the opposite side of the membrane to the substrate, arrangements are known where the backplate is formed closest to the substrate with the membrane layer supported above it.

In order to process an electrical output signal from the microphone, the die/device may have circuit regions (not shown) that are integrally fabricated using standard CMOS processes on the substrate 1. The circuit regions may comprise conducting (for example aluminium, AlSi, TiN or copper) circuit interconnects that are used to electrically connect to the microphone via interconnect points to the circuit region.

The circuit regions may be fabricated in the CMOS silicon substrate using standard processing techniques such as ion implantation, photomasking, metal deposition and etching. The circuit regions may comprise any circuit operable to interface with a MEMS microphone and process associated signals. For example, one circuit region may be a pre-amplifier connected so as to amplify an output signal from the microphone. In addition another circuit region may be a charge-pump that is used to generate a bias, for example 10 volts, across the two electrodes. This has the effect that changes in the electrode separation (i.e. the capacitive plates of the microphone) change the MEMS microphone capacitance; assuming constant charge, the voltage across the electrodes is correspondingly changed. A pre-amplifier, preferably having high impedance, is used to detect such a change in voltage.

The circuit regions may optionally comprise an analogue-to-digital converter (ADC) to convert the output signal of the microphone or an output signal of the pre-amplifier into a corresponding digital signal, and optionally a digital signal processor to process or part-process such a digital signal. Furthermore, the circuit regions may also comprise a digital-to-analogue converter (DAC) and/or a transmitter/receiver suitable for wireless communication. However, it will be appreciated by one skilled in the art that many other circuit arrangements operable to interface with a MEMS transducer signal and/or associated signals, may be envisaged.

It will also be appreciated that, alternatively, the microphone device may be a hybrid device (for example whereby the electronic circuitry is totally located on a separate integrated circuit, or whereby the electronic circuitry is partly located on the same device as the microphone and partly located on a separate integrated circuit) or a monolithic device (for example whereby the electronic circuitry is fully integrated within the same integrated circuit as the microphone).

Although the various embodiments describe a MEMS capacitive microphone, the invention is also applicable to any form of MEMS transducers other than microphones, for example pressure sensors or ultrasonic transmitters/receivers.

Examples described herein may be usefully implemented in a range of different material systems, however the examples described herein are particularly advantageous for MEMS transducers having membrane layers comprising silicon nitride.

It is noted that the example embodiments described above may be used in a range of devices, including, but not limited to: analogue microphones, digital microphones, pressure sensor or ultrasonic transducers. The example embodiments may also be used in a number of applications, including, but not limited to, consumer applications, medical applications, industrial applications and automotive applications. For example, typical consumer applications include portable audio players, laptops, mobile phones, PDAs and personal computers. Example embodiments may also be used in voice activated or voice controlled devices. Typical medical applications include hearing aids. Typical industrial applications include active noise cancellation. Typical automotive applications include hands-free sets, acoustic crash sensors and active noise cancellation.

Features of any given aspect or example embodiment may be combined with the features of any other aspect or example embodiment and the various features described herein may be implemented in any combination in a given embodiment.

Associated methods of fabricating a MEMS transducer are provided for each of the example embodiments.

In the examples described above it is noted that references to a transducer may comprise various forms of transducer element. For example, a transducer may be typically mounted on a die and may comprise a single membrane and back-plate combination. In another example a transducer die comprises a plurality of individual transducers, for example multiple membrane/back-plate combinations. The individual transducers of a transducer element may be similar, or configured differently such that they respond to acoustic signals differently, e.g. the elements may have different sensitivities. A transducer element may also comprise different individual transducers positioned to receive acoustic signals from different acoustic channels.

It is noted that in the examples described herein a transducer element may comprise, for example, a microphone device comprising one or more membranes with electrodes for read-out/drive deposited on the membranes and/or a substrate or back-plate. In the case of MEMS pressure sensors and microphones, the electrical output signal may be obtained by measuring a signal related to the capacitance between the electrodes. The examples are also intended to embrace a transducer element being a capacitive output transducer, wherein a membrane is moved by electrostatic forces generated by varying a potential difference applied across the electrodes, including examples of output transducers where piezo-electric elements are manufactured using MEMS techniques and stimulated to cause motion in flexible members.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. An assembly comprising:
    a MEMS device comprising a MEMS transducer; and
    a package substrate, wherein a top surface of the MEMS device is bonded to an upper surface of the package substrate at a bond region, wherein the MEMS transducer comprises:
    a transducer substrate having a cavity which forms a cavity opening in an upper surface of the transducer substrate; and a flexible membrane supported so as to overlie the cavity, wherein the top surface of the MEMs device comprises a barrier region, the barrier region being at least partially provided laterally outside a region which overlies the cavity opening in the upper surface of the transducer substrate.

2. The MEMS device as claimed in claim 1, wherein the barrier region comprises one or more discontinuities in the surface of the MEMS device.

3. The MEMS device as claimed in claim 2, wherein the discontinuities alter the wettability of the top surface.

4. The MEMS device as claimed in claim 2, wherein the discontinuities serve to inhibit the flow of a liquid.

5. The MEMS device as claimed in claim 1, wherein the barrier region comprises a plurality of dimples formed in the upper surface of the MEMS device.

6. The MEMS device as claimed in claim 5, wherein one of more of the dimples comprises one or more of a depressed region of material or a region where material forming the first outer surface of the MEMS device has been removed.

7. The MEMS device as claimed in claim 1, wherein the barrier region comprises at least one trench formed in the upper surface of the MEMS device.

8. The MEMS device as claimed in claim 1, wherein the barrier region does not extend into a region overlying a central region of the cavity.

9. The MEMS device as claimed in claim 1, the MEMS transducer comprising a backplate wherein the flexible membrane is interposed between said backplate and the cavity, and wherein the backplate overlies the cavity.

10. The MEMS device a claimed in claim 9, wherein the barrier region is formed in at least one layer of material which is deposited to form the backplate.

11. The MEMS device as claimed in claim 9, wherein the dimples are formed during one or more processing steps to form a plurality of holes in the backplate.

12. The MEMS device as claimed in claim 9, wherein the barrier region is provided laterally outside a region which overlies the backplate.

13. The MEMS device as claimed in claim 9, wherein the barrier region is provided in a layer of silicon nitride.

14. The electronic device comprising a MEMS device as claimed in claim 1, wherein said device is at least one of: a portable device; a battery powered device; an audio device; a computing device; a communications device; a personal media player; a mobile telephone; a games device; and a voice controlled device.

15. The assembly comprising a MEMS device as claimed in claim 1 and a package substrate, wherein the top surface of the MEMS device is bonded to the upper surface of the package substrate at a bond region.

16. The assembly as claimed in claim 15, wherein the flexible membrane of the transducer overlies a sound port provided with the substrate and wherein the bond region forms an acoustic seal between the sound port and the MEMS transducer.

17. The assembly as claimed in claim 16, wherein the barrier region is provided laterally inside the bond region.

18. The assembly as claimed in claim 16, wherein the barrier region defines a ring which substantially encircles a region overlying the transducer.

19. An assembly comprising:
a micro-electro-mechanical system (MEMS) device comprising a MEMS transducer; and
a package substrate, wherein a top surface of the MEMS device is bonded to an upper surface of the package substrate at a bond region,
wherein the MEMS transducer comprises a transducer substrate having a cavity which forms a cavity opening in an upper surface of the transducer substrate and a flexible membrane supported so as to overlie the cavity, wherein a top surface of the MEMS device comprises a barrier region, the barrier region being at least partially provided laterally outside a region which overlies the cavity opening and wherein the barrier region defines a ring which substantially encircles the region which overlies the cavity.

\* \* \* \* \*

UNITED STATES PATENT AND TRADEMARK OFFICE
CERTIFICATE OF CORRECTION

| | | |
|---|---|---|
| PATENT NO. | : 11,337,010 B2 | Page 1 of 1 |
| APPLICATION NO. | : 16/605155 | |
| DATED | : May 17, 2022 | |
| INVENTOR(S) | : Piechocinski et al. | |

It is certified that error appears in the above-identified patent and that said Letters Patent is hereby corrected as shown below:

In the Claims

1. In Column 14, Lines 13, in Claim 1, delete "MEMs" and insert -- MEMS --, therefor.

2. In Column 14, Line 29, in Claim 6, delete "of more" and insert -- or more --, therefor.

3. In Column 14, Line 42, in Claim 10, delete "device a" and insert -- device as --, therefor.

4. In Column 14, Line 53, in Claim 14, delete "a MEMS" and insert -- the MEMS --, therefor.

5. In Column 14, Line 59, in Claim 15, delete "a MEMS" and insert -- the MEMS --, therefor.

6. In Column 15, Lines 1-2, in Claim 17, delete "the barrier region" and insert -- a barrier region --, therefor.

7. In Column 15, Lines 3-4, in Claim 18, delete "the barrier region" and insert -- a barrier region --, therefor.

8. In Column 15, Line 16, in Claim 19, delete "a top" and insert -- the top --, therefor.

Signed and Sealed this
Fifth Day of September, 2023

*Katherine Kelly Vidal*
Katherine Kelly Vidal
*Director of the United States Patent and Trademark Office*